United States Patent
Sai et al.

(10) Patent No.: US 11,027,918 B2
(45) Date of Patent: Jun. 8, 2021

(54) TRANSFER DEVICE AND STACKER CRANE

(71) Applicant: Murata Machinery, Ltd., Kyoto (JP)

(72) Inventors: Jun Sai, Ise (JP); Kazuhiro Ishikawa, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/748,988

(22) Filed: Jan. 22, 2020

(65) Prior Publication Data

US 2020/0270058 A1 Aug. 27, 2020

(30) Foreign Application Priority Data

Feb. 22, 2019 (JP) ............... JP2019-030681

(51) Int. Cl.
*B65G 1/04* (2006.01)

(52) U.S. Cl.
CPC ........ *B65G 1/0435* (2013.01); *B65G 2207/08* (2013.01)

(58) Field of Classification Search
CPC ..... B65G 1/0435; B65G 1/04; B65G 2207/08
USPC .................................................. 198/370.01
See application file for complete search history.

(56) References Cited

U.S. PATENT DOCUMENTS

| | | | |
|---|---|---|---|
| 8,998,561 B2* | 4/2015 | Furuya | H01L 21/67766 414/744.8 |
| 9,878,453 B2* | 1/2018 | Bonora | B25J 15/0028 |
| 9,881,823 B2* | 1/2018 | Doherty | H01L 21/67733 |
| 2008/0131239 A1* | 6/2008 | Rebstock | B25J 9/00 414/225.01 |
| 2012/0321417 A1* | 12/2012 | Bonora | H01L 21/68707 414/217 |
| 2013/0051966 A1* | 2/2013 | Kim | H01L 21/67769 414/751.1 |
| 2016/0315002 A1* | 10/2016 | Komatsu | B24B 37/345 |
| 2019/0214290 A1* | 7/2019 | Marcelynas | H01L 21/68742 |

FOREIGN PATENT DOCUMENTS

JP 2007-055698 A 3/2007
JP 4826941 B2 * 11/2011

* cited by examiner

*Primary Examiner* — Gene O Crawford
*Assistant Examiner* — Lester Rushin, III
(74) *Attorney, Agent, or Firm* — DLA Piper LLP (US)

(57) ABSTRACT

A transfer device and a stacker crane can stabilize the posture of a conveyed object on a placement portion in a horizontal direction even when the conveyed object is conveyed at high speed. The transfer device transfers the storage container by advancing and retreating the hand on which the storage container is placed. The transfer device is provided with a gripper that grips the storage container placed on a hand in the X direction that is the horizontal direction.

8 Claims, 9 Drawing Sheets

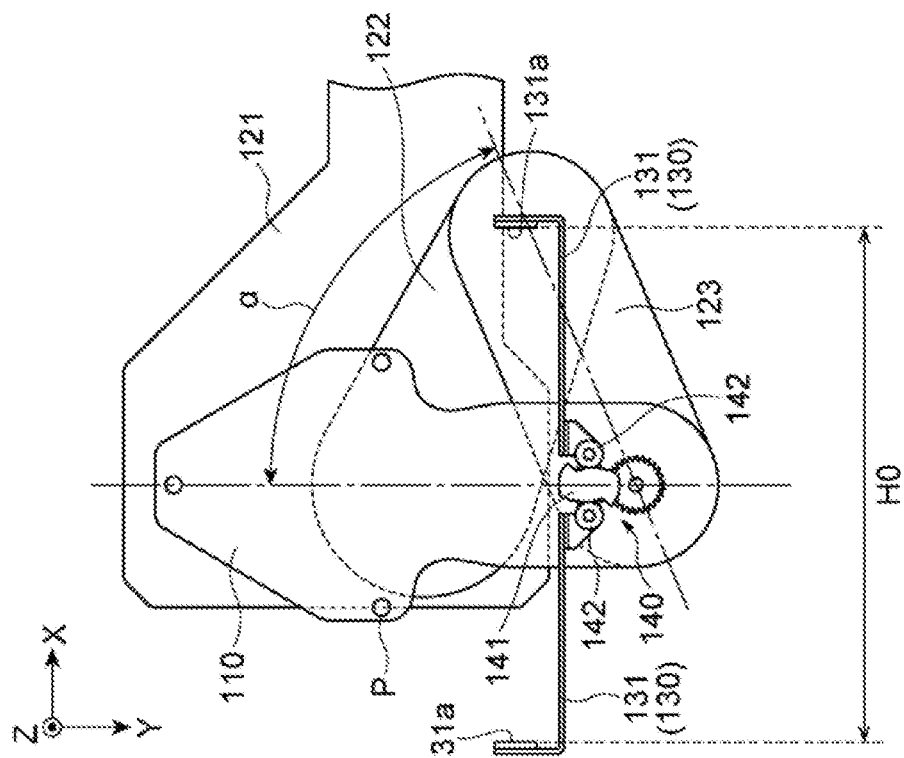
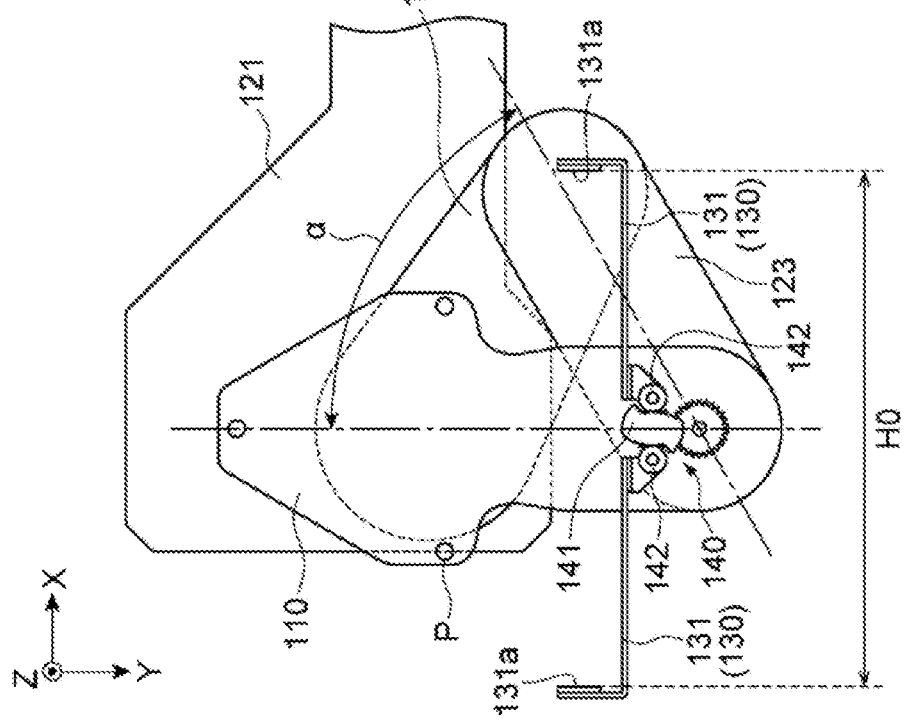

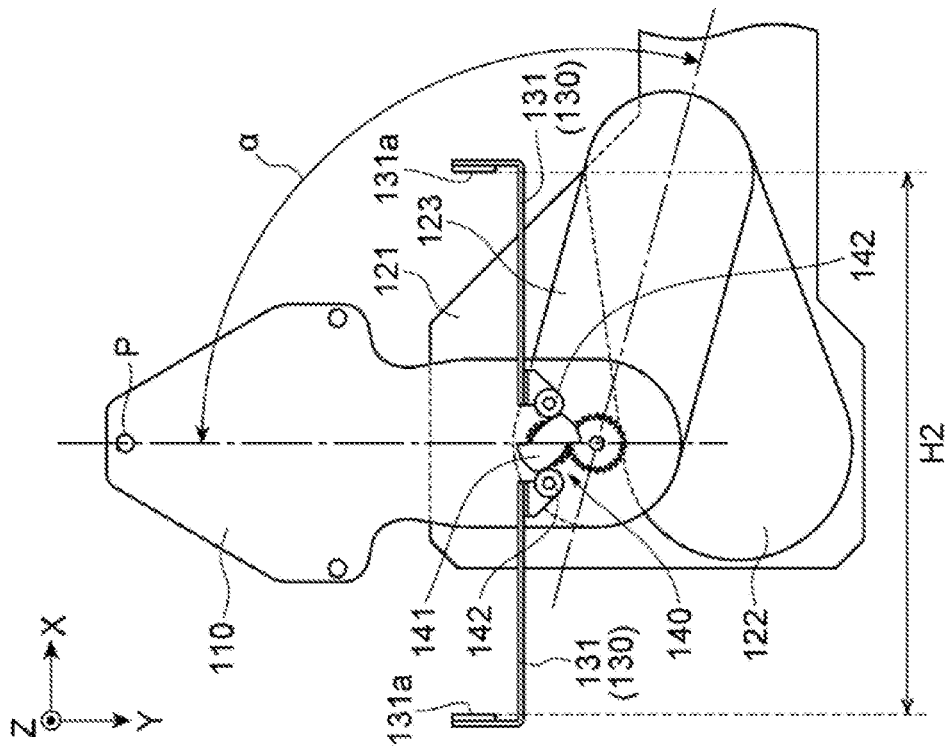
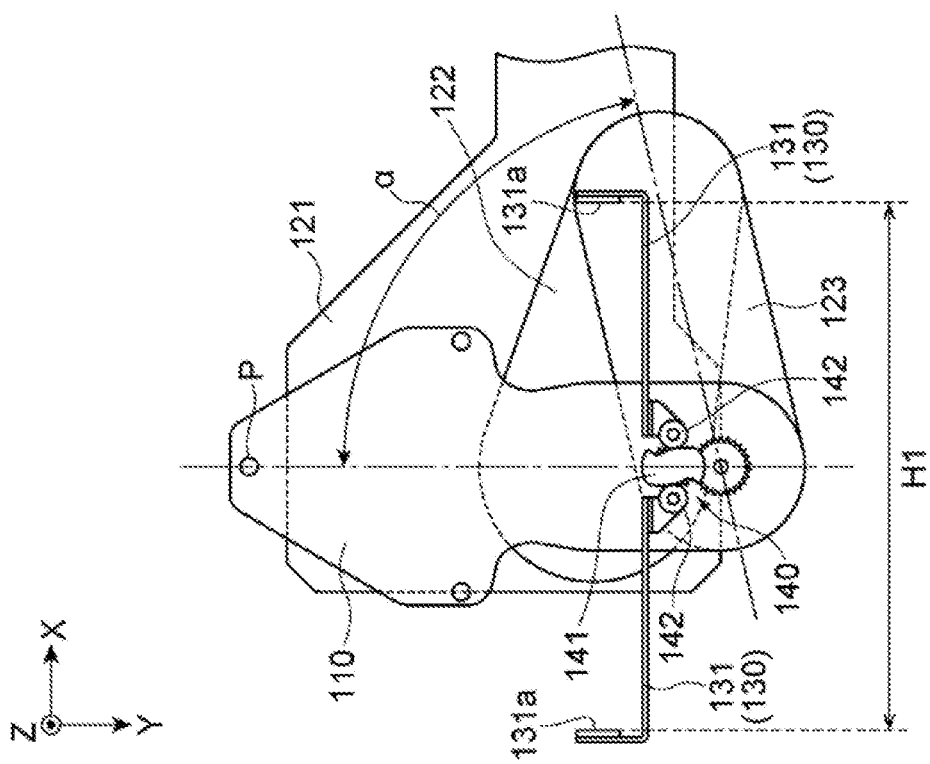

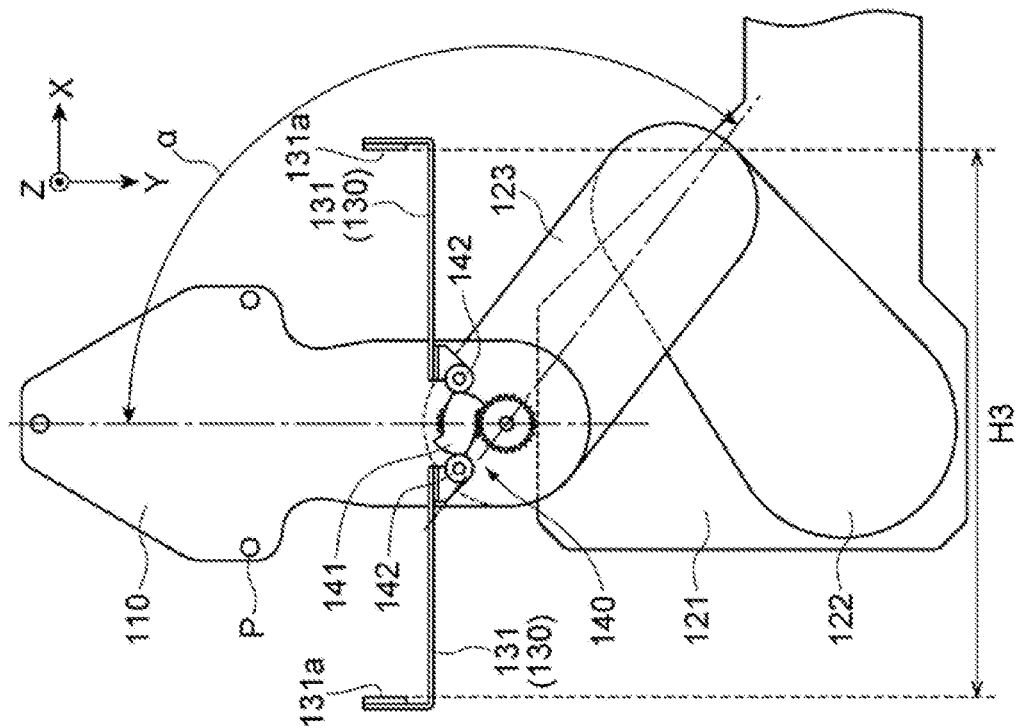
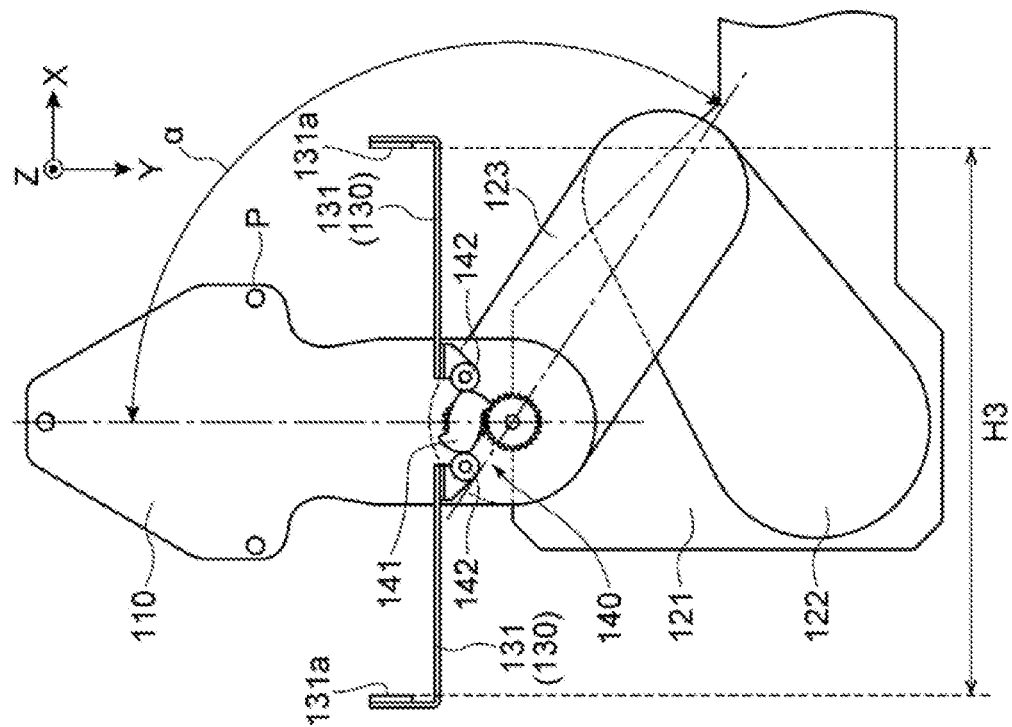

TRANSFER DEVICE AND STACKER CRANE

TECHNICAL FIELD

This disclosure relates to a transfer device and a stacker crane.

BACKGROUND

Japanese Patent No. A4826941 describes a stacker crane provided with a transfer device (a robot) that transfers a conveyed object by advancing and retreating a placement portion on which the conveyed object is placed. The stacker crane described in Japanese Patent No. 4826941 is provided with pressing support means that presses a conveyed object placed on the placement portion from above to prevent the conveyed object from falling from the placement portion.

Regarding the above-described technique, when a conveyed object is conveyed at high speed, the conveyed object on the placement portion sometimes tilts in the horizontal direction, or vibration is sometimes not easily kept within a standard range. Therefore, it is necessary to reduce the conveyance speed to a speed at which the conveyed object does not tilt, for example, and it is desirable to stabilize the posture of the conveyed object on the placement portion in the horizontal direction even when the conveyed object is conveyed at high speed.

It could therefore be helpful to provide a transfer device and a stacker crane that can stabilize the posture of a conveyed object on a placement portion in the horizontal direction even when the conveyed object is conveyed at high speed.

SUMMARY

We Thus Provide:

A transfer device for transferring a conveyed object by advancing and retreating a placement portion on which the conveyed object is placed and includes a gripper that grips a conveyed object placed on the placement portion in the horizontal direction.

A conveyed object placed on the placement portion is gripped by the gripper in the horizontal direction. Therefore, it becomes possible to stabilize the posture of the conveyed object on the placement portion in the horizontal direction even when the conveyed object is conveyed at high speed. In addition, by gripping the conveyed object with a frictional force of a predetermined value or more, it is possible to stabilize the posture of the conveyed object not only in the horizontal direction, but also in the vertical direction, and prevent the conveyed object from falling from the placement portion.

The gripper is configured to be able to open and close between an open state in which the conveyed object is not gripped and a closed state in which the conveyed object is gripped, and an interlocking mechanism that interlocks advancing/retreating of the placement portion with opening/closing of the gripper may be further provided. In this configuration, the opening/closing operation time of the gripper does not become an idle time, and it is possible to suppress influence of the opening/closing operation on the time (so-called cycle time) required for transferring the conveyed object.

The interlocking mechanism may include a cam configured to rotate in accordance with advancing/retreating of the placement portion, a follower that is in contact with the cam and follows along the horizontal direction, and a coupling unit that couples the follower to the gripper. It is possible with this configuration to efficiently realize interlocking by the interlocking mechanism.

The cam may have a cam shape in which the gripper has a certain opening width when the placement portion has advanced a certain distance or more. In this configuration, the gripper is not opened more than a certain opening width while the placement portion advances and, therefore, it becomes possible to cope with a situation where there is little clearance around the conveyed object at the transfer destination (e.g., a storage shelf of a stocker).

The conveyed object may include a narrow portion having a width smaller than the maximum width in the horizontal direction as the gripping direction of the gripper, and the gripper may grip the narrow portion of the conveyed object. It is possible with this configuration to reduce the width in the gripping direction of the gripper in a state in which the conveyed object is gripped. Accordingly, it becomes possible to cope with a situation where there is little clearance around the conveyed object at the transfer destination.

The transfer device may further include a plurality of positioning pins erected on the placement portion and support the conveyed object. When such a plurality of positioning pins are provided, floating of a conveyed object (tilting of the conveyed object with any one of the plurality of positioning pins as a fulcrum) may possibly occur when the conveyed object placed on the placement portion is pressed from above, for example. In this respect, since the gripper grips the conveyed object on the placement portion in the horizontal direction, it is possible to avoid floating of the conveyed object even when a plurality of positioning pins are provided.

A stacker crane includes the above transfer device, a turning unit that turns the transfer device, and an elevating unit that elevates and lowers the transfer device.

This stacker crane provided with the above transfer device also exhibits the above effect, that is, an effect of stabilizing the posture of the conveyed object on the placement portion in the horizontal direction even when the conveyed object is transferred (especially turned) at high speed.

It thus becomes possible to stabilize the posture of a conveyed object on the placement portion in the horizontal direction even when the conveyed object is conveyed at high speed.

BRIEF DESCRIPTION OF THE DRAWINGS

FIG. 6A is a plan view illustrating a hand and a gripper when the hand lies at the origin in the transfer device in FIG. 1.

FIG. 6B is a plan view illustrating a hand and a gripper when the hand has advanced a predetermined distance from the position of FIG. 6A in the transfer device in FIG. 1.

FIG. 7A is a plan view illustrating a hand and a gripper when the hand lies at the second origin in the transfer device in FIG. 1.

FIG. 7B is a plan view illustrating a hand and a gripper when the hand has advanced a predetermined distance from the position of FIG. 7A in the transfer device in FIG. 1.

FIG. 8A is a plan view illustrating a hand and a gripper when the hand has advanced a predetermined distance from the position of FIG. 8B in the transfer device in FIG. 1.

FIG. 8B is a plan view illustrating a hand and a gripper when the hand lies at a transfer point in the transfer device in FIG. 1.

DETAILED DESCRIPTION

Figure 1:
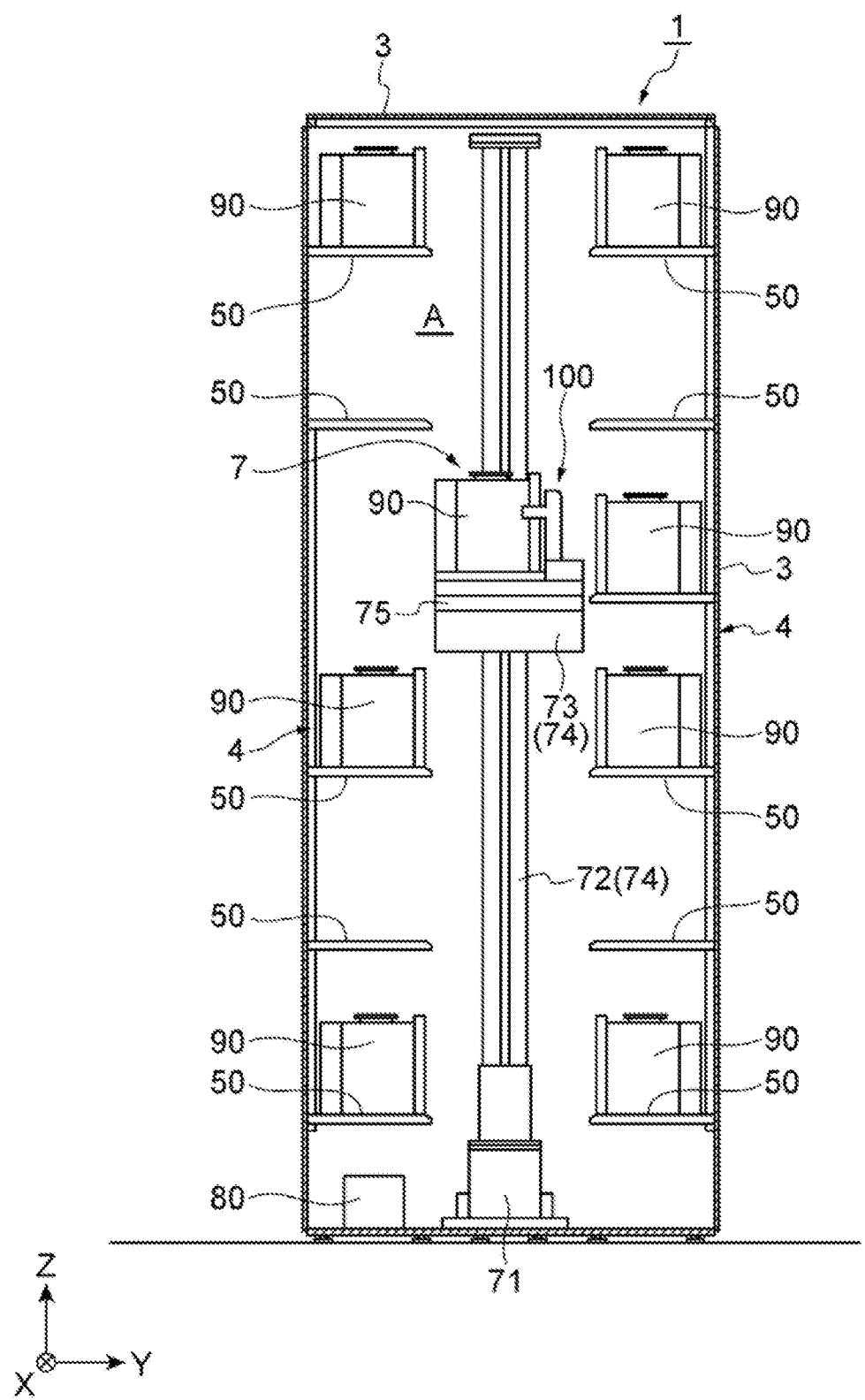
FIG. 1 is a sectional view illustrating a stocker provided with a stacker crane according to an example.

Hereinafter, a preferred example will be described in detail with reference to the drawings. It is to be noted that the same elements are denoted by the same reference numerals, and redundant description is omitted in the description of the drawings.

A stocker provided with a stacker crane according to an example will be described. As illustrated in FIG. 1, a stocker 1 functions as a storage that stores storage containers (conveyed objects) 90 such as a front opening unified pod (FOUP) in which storage objects such as a semi-conductor wafer and a glass substrate are stored. The stocker 1 is provided in a clean room, for example. The stocker 1 is mainly provided with a main body 3, racks 4, a stacker crane 7, and a controller 80.

The main body 3 is a part that defines an internal space A of the stocker 1 and formed by a plurality of partitions. The racks 4 are each a part on which a storage container 90 is placed, and usually provided in one or two rows (here, two rows). Each rack 4 extends in the X direction (width direction), and two adjacent racks 4 and 4 are arranged substantially in parallel to face each other.

Each rack 4 has a storage shelf 50 on which a storage container 90 is placed and stored. The storage shelves 50 are aligned along the X direction and the Z direction (vertical direction). In the following description, a side on which the storage shelves 50 are disposed as viewed from the stacker crane 7 is referred to as a front side, the opposite side is referred to as a rear side, movement toward the front side is described as advancing, and movement toward the rear side is described as retreating.

The stacker crane 7 is a mechanism that moves a storage container 90 into and out of a storage shelf 50 and also moves a storage container 90 between storage shelves 50. The stacker crane 7 is disposed in a region sandwiched between the opposing racks 4 and 4. The stacker crane 7 can move in the X direction along the rack 4 by traveling on a track (unillustrated) disposed on a floor surface along the extending direction (X direction) of the rack 4.

The stacker crane 7 is provided with a traveling unit 71, an elevating unit 74, a turning unit 75, and a transfer device 100. The traveling unit 71 is provided to be caused by a travelling driving part such as a motor to travel on a track in the X direction. The elevating unit 74 elevates and lowers the transfer device 100. The elevating unit 74 includes a supporting column 72 and a mounting stand 73. The supporting column 72 is a member provided above the traveling unit 71 and extends in the vertical direction. The transfer device 100 is mounted on the mounting stand 73 via the turning unit 75. The mounting stand 73 is provided to be caused by an elevation drive unit such as a motor to move up and down along the supporting column 72.

The turning unit 75 turns the transfer device 100. The transfer device 100 is mounted on the turning unit 75. The turning unit 75 rotates the transfer device 100 in a direction of rotation on an axis along the Z direction. The configuration, mechanism, or arrangement of the traveling unit 71, the elevating unit 74, and the turning unit 75 is not particularly limited. Various known mechanisms or devices can be employed as the traveling unit 71, the elevating unit 74, and the turning unit 75.

The controller 80 (see FIG. 1) controls each unit in the stacker crane 7. The controller 80 is disposed inside the main body 3, for example. The controller 80 has a central processing unit (CPU), a random access memory (RAM), a read only memory (ROM) and the like. In the controller 80, various controls are executed by cooperation of hardware such as a CPU, a RAM, and a ROM with software such as a program.

Figure 2:
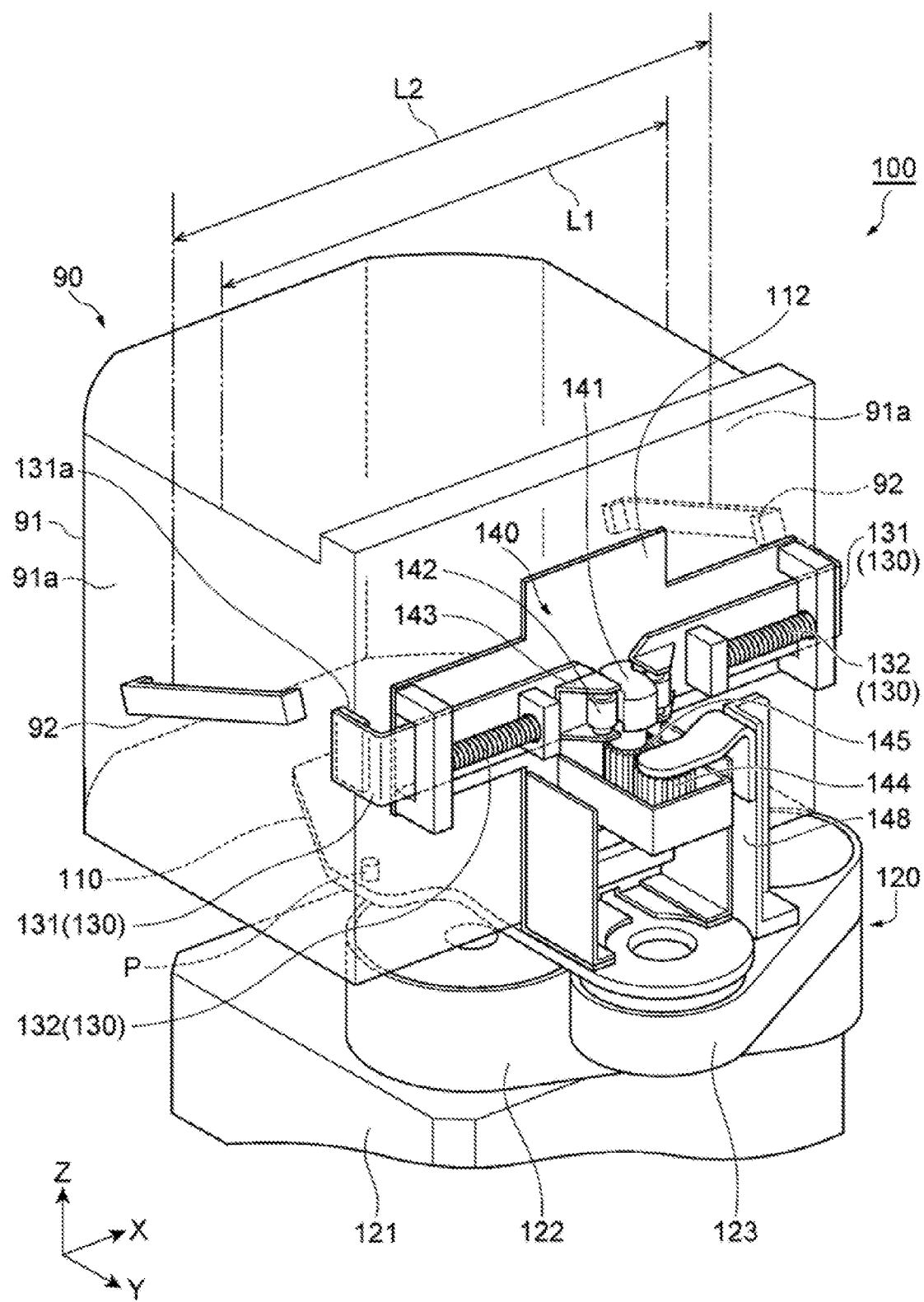
FIG. 2 is a perspective view illustrating when the gripper is in a closed state in the transfer device in FIG. 1.
Figure 3:
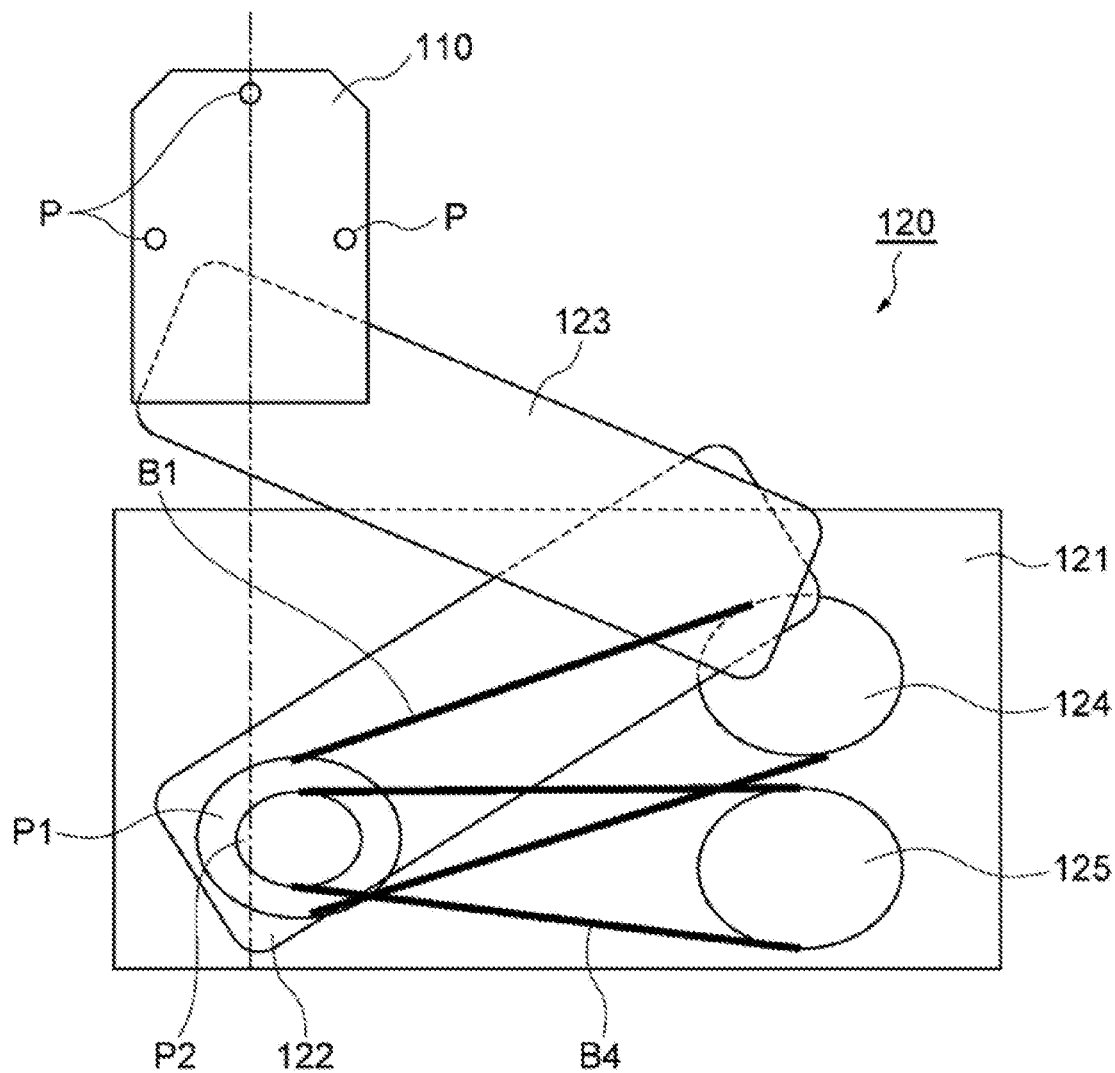
FIG. 3 is a plan view illustrating a hand and an arm portion of the transfer device in FIG. 1.

Next, the transfer device 100 will be described in detail. As illustrated in FIGS. 2 and 3, the transfer device 100 is provided with a hand (a placement portion) 110, an arm portion 120, a gripper 130, and an interlocking mechanism 140. The transfer device 100 transfers a storage container 90 by advancing and retreating the hand 110.

A storage container 90 has a container body 91, and grips 92 to be used during conveyance by an operator. The grips 92 are respectively provided on side surfaces 91a of the container body 91 opposing each other in the X direction. Each grip 92 constitutes a convex portion that protrudes in the X direction. In such a storage container 90, the width including one and the other grips 92 is the maximum width L2 in the X direction, and the width L1 in the X direction of the container body 91 is narrower than the maximum width. That is, the container body 91 corresponds to the narrow portion. The width L1 corresponds to the distance from one side surface 91a to the other side surface 91a.

The hand 110 is a member on which a storage container 90 is placed. The hand 110 is a plate-like member that is long in the Y direction and has a thickness direction in the Z direction. The hand 110 has a plurality of positioning pins P. Each positioning pin P is erected on the hand 110 and supports the storage container 90. In the illustrated example, the positioning pins P are provided at three points on an upper surface of the hand 110. The three positioning pins P are provided to not line up in a straight line.

Figure 4:
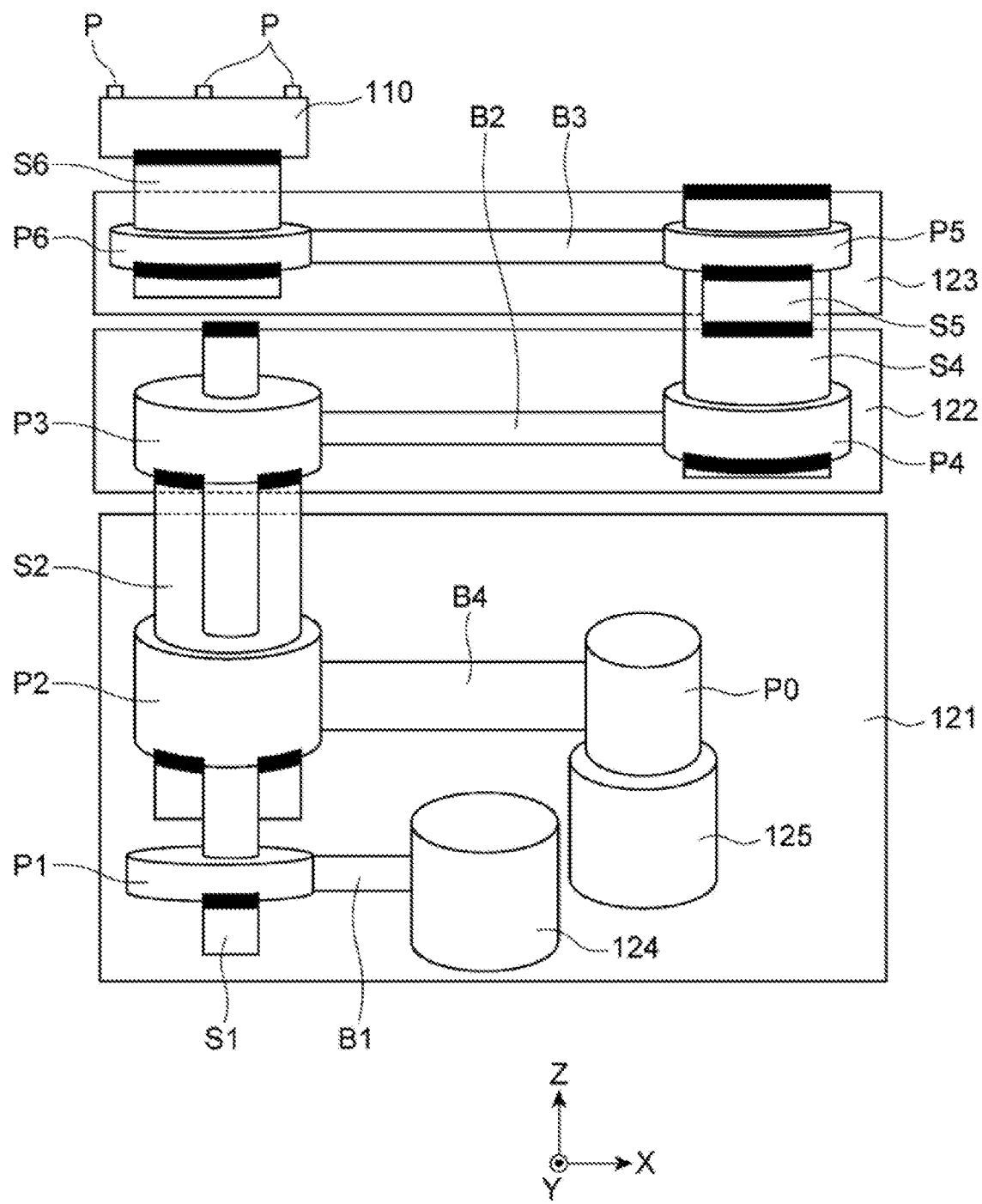
FIG. 4 is a front view illustrating a hand and an arm portion of the transfer device in FIG. 1.

As illustrated in FIGS. 3 and 4, the arm portion 120 is an arm-type drive unit that advances and retreats the hand 110. The arm portion 120 has an arm base 121, a first arm 122, a second arm 123, a turning motor 124, and a telescopic motion motor 125. One end portion of the first arm 122 is coupled to the arm base 121 to be freely turnable (freely swingable) on an axis along the Z direction. One end portion of the second arm 123 is coupled to the other end portion of the first arm 122 to be freely turnable on an axis along the Z direction. A rear end portion of the hand 110 is coupled to the other end portion of the second arm 123 to be freely turnable on an axis along the Z direction.

In the arm portion 120, a pulley P1 is fixed to a shaft 51, and the shaft 51 fastened to the first arm 122. Turning operation of the first arm 122 can be realized by applying a driving force to the pulley P1 via a belt B1 from the turning motor 124. In addition, in the arm portion 120, a pulley P2 is fixed to a shaft S2, and a pulley P3 is fixed to the shaft S2. The pulley P3 is coupled to a pulley P4 via a belt B2, the pulley P4 is fixed to a shaft S4, and the shaft S4 is fastened to the second arm 123. A pulley P5 is fixed to a shaft S5, and the shaft S5 is fastened to the first arm 122. The pulley P5 is coupled to a pulley P6 via a belt B3, the pulley P6 is fixed to a shaft S6, and the shaft S6 is fastened to the hand 110. Turning operation of the second arm 123 and the hand 110 can be realized by applying a driving force to the pulley P2 via a pulley P0 and a belt B4 from the telescopic motion motor 125.

In such an arm portion 120, cooperation of the turning motor 124 and the telescopic motion motor 125 causes the hand 110 to move linearly in the Y direction, that is, advances and retreats the hand 110. The turning motor 124 and the telescopic motion motor 125 may further include a speed reducer and a pulley. The turning motor 124 and the telescopic motion motor 125 are not especially limited, and various known telescopic motion motors and turning motors can be used.

Referring back to FIG. 2, the gripper 130 grips a storage container 90 placed on the hand 110 in the X direction (horizontal direction). Specifically, the gripper 130 grips the container body 91 of the storage container 90 placed on the hand 110. The gripper 130 is configured to be able to open and close between an open state in which the storage container 90 is not gripped and a closed state in which the storage container 90 is gripped.

The gripper 130 is provided on the hand 110. The gripper 130 has a pair of clamps 131 and a pair of springs (elastic members) 132. The pair of clamps 131 are members that sandwich the storage container 90. Each clamp 131 has an L plate shape having a tip portion bent when viewed from above. A contact portion 131a that comes into contact with a side surface 91a of the container body 91 of the storage container 90 is provided at the tip portion of each clamp 131. Each clamp 131 is supported to be movable in the X direction with respect to a supporting frame 112 on the hand 110. The pair of clamps 131 are arranged in directions such that the respective contact portions 131a oppose each other.

Each of the pair of springs 132 applies a certain elastic force to each of the pair of clamps 131 in a direction in which the storage container 90 is sandwiched. One end of each spring 132 is coupled to the supporting frame 112. The other end of each spring 132 is coupled to a base end side of each clamp 131. Each spring 132 is disposed in a compressed state, for example, and biases each clamp 131 in the X direction.

Figure 5:
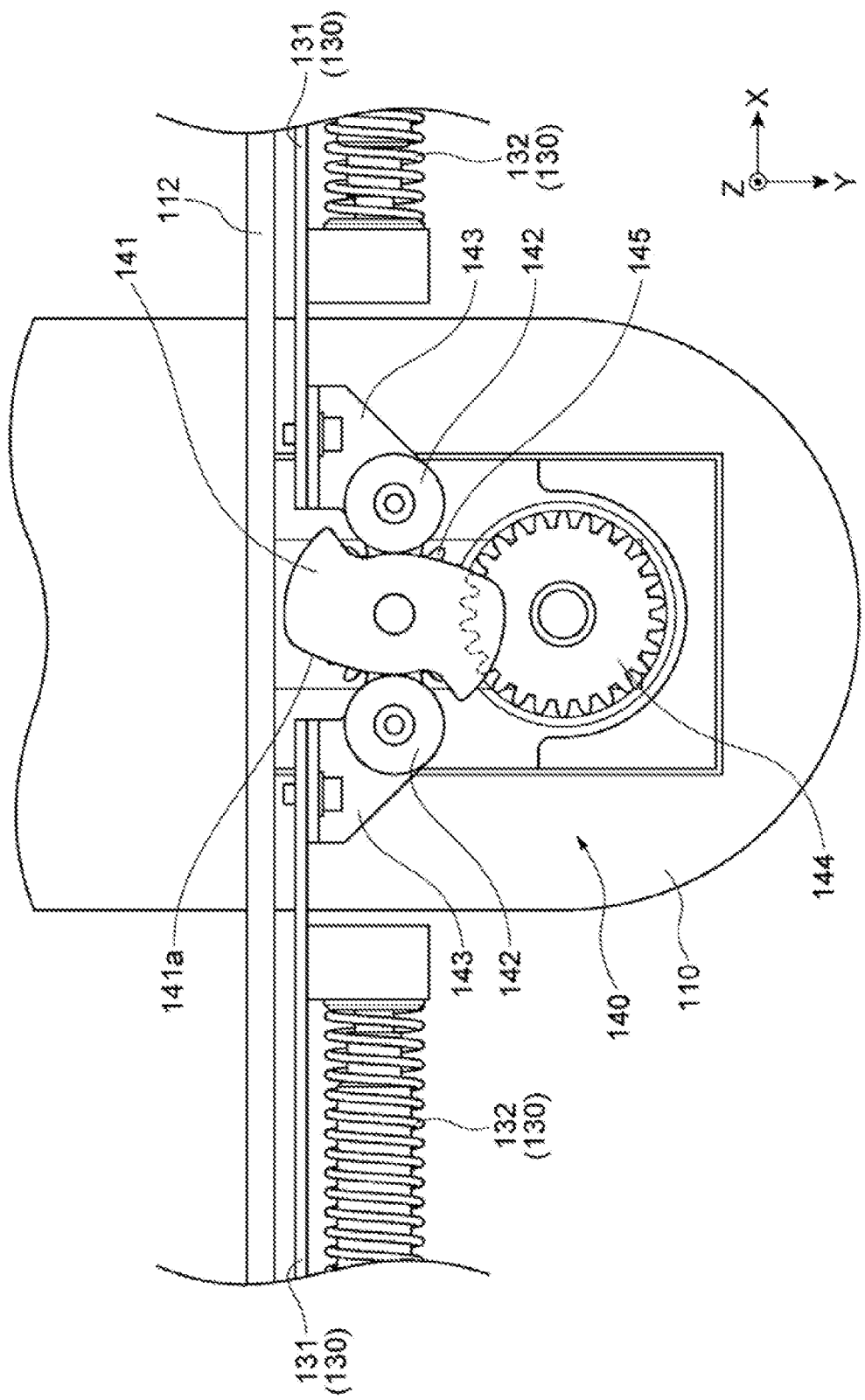
FIG. 5 is an enlarged plan view illustrating an interlocking mechanism of the transfer device in FIG. 1.

As illustrated in FIGS. 2 and 5, the interlocking mechanism 140 is a mechanism that interlocks advancing/retreating of the hand 110 with opening/closing of the gripper 130. The interlocking mechanism 140 includes a cam 141, followers 142, coupling units 143, a large gear 144, and a small gear 145.

The cam 141 is supported on the hand 110 to be rotatable on a central axis along the Z direction. The cam 141 is configured to rotate in accordance with advancing/retreating of the hand 110. The cam 141 is configured to be rotated by the large gear 144 and the small gear 145 with change in an angle α (which will be hereinafter referred to simply as "an angle α" as shown in FIG. 6) between the hand 110 and the second arm 123 (as will be described later in detail). The angle α is an angle formed by the longitudinal direction (center line) of the hand 110 and the longitudinal direction (center line) of the second arm 123 as viewed from the Z direction. In other words, the angle α is a relative angle around an axis along the Z direction of the hand 110 with respect to the second arm 123.

Each follower 142 is in contact with a cam 141 and follows along the X direction. Each follower 142 is a roller rotatable on a central axis along the Z direction. A pair of followers 142 are arranged to sandwich the cam 141 in the X direction. Each follower 142 is in contact with a cam surface 141a as a side surface of the cam 141 and follows in the X direction as the cam 141 rotates. Each coupling unit 143 couples each of the pair of followers 142 to each of the pair of clamps 131. In the illustrated example, each coupling unit 143 couples a follower 142 to a base end portion of a clamp 131. According to such a configuration, the clamps 131 move in the X direction in synchronization with following of the followers 142 in the X direction, and the gripper 130 is opened and closed.

The large gear 144 is fixed to the second arm 123. The large gear 144 is supported by the second arm 123 via a bracket 148 to be coaxial with a shaft that couples the hand 110 to the second arm 123 to be freely turnable. The small gear 145 meshes with the large gear 144 and rotates. The small gear 145 is coupled to the cam 141 on the hand 110 to be coaxial with the central axis of the cam 141. The small gear 145 is supported to be rotatable on a central axis integrally with the cam 141. According to such a configuration, when the angle α changes as the hand 110 advances and retreats, the small gear 145 that meshes with the large gear 144 rotates, and the cam 141 rotates accordingly.

As illustrated in FIG. 5, the cam 141 has a cam shape in which the gripper 130 has a certain open-state opening width (a certain opening width) when the hand 110 has advanced a certain distance or more. Specifically, the cam surface 141a of the cam 141 has a first circular region having a first diameter when viewed from the Z direction, a second circular region having a second diameter larger than the first diameter when viewed from the Z direction, and a continuous region that is smoothly continuous with the first circular region and the second circular region as viewed from the Z direction.

The first circular region is a region where the follower 142 comes into contact when the hand 110 has retreated backward from the second origin, for example, and is a region where the gripper 130 is put into a closed state and the gripper 130 has a certain closed-state opening width. The second circular region is a region where the follower 142 comes into contact when the hand 110 has advanced a certain distance or more (here, advanced over a position in front of the second origin and behind the transfer point), and is a region where the gripper 130 is put into an open state and the gripper 130 has a certain open-state opening width. The continuous region is a region where the gripper 130 is opened and closed, and the opening width of the gripper 130 is changed between the closed-state opening width and the open-state opening width.

The second origin is a reference position of the hand 110 when the storage container 90 is not placed on the hand 110. The transfer point is a reference position of the hand 110 when a storage container 90 is unloaded from the hand 110 to a storage shelf 50 or when a storage container 90 is loaded from a storage shelf 50 to the hand 110. A first origin described later is a reference position of the hand 110 when a storage container 90 is placed on the hand 110.

Next, the opening/closing operation of the gripper 130 will be described. In the following description, an example is illustrated where the hand 110 is advanced from the position of the first origin through the position of the second origin to the position of the transfer point while a storage container 90 on the hand 110 is transferred onto a storage shelf 50.

When the hand 110 is located at the position of the first origin as illustrated in FIG. 6A, the followers 142 are in contact with the first circular region of the cam surface 141a, and the followers 142 are located at positions (bottom dead centers) closest to the cam 141. The pair of clamps 131 are in a positional relationship closest to each other in the X direction, the gripper 130 is in a closed state, and the opening width of the gripper 130 is a closed-state opening width H0. A storage container 90 is sandwiched by the pair of clamps 131 in the X direction.

When the hand 110 advances a predetermined distance as illustrated in FIG. 6B, the angle α increases, and the cam 141 rotates accordingly. Although the cam 141 rotates, the followers 142 are continuously in contact with the first circular region of the cam surface 141a, and the followers 142 do not move and continuously lie at the bottom dead centers. The gripper 130 remains in a closed state, and the opening width of the gripper 130 is continuously the closed-state opening width H0. The storage container 90 is continuously sandwiched by the pair of clamps 131 in the X direction.

When the hand 110 further advances to the position of the second origin as illustrated in FIG. 7A, the angle α further increases, and the cam 141 further rotates accordingly. The followers 142 come into contact with the continuous region of the cam surface 141a, and the followers 142 move away from the cam 141. The pair of clamps 131 move away from each other in the X direction, and the gripper 130 transitions from a closed state to an open state. The opening width of the gripper 130 becomes a first transition-state opening width H1 that is larger than the closed-state opening width H0.

When the hand 110 further advances a predetermined distance as illustrated in FIG. 7B, the angle α further increases, and the cam 141 further rotates accordingly. The followers 142 are continuously in contact with the continuous region of the cam surface 141a, and the followers 142 continuously move away from the cam 141. The pair of clamps 131 continuously move away from each other in the X direction. The opening width of the gripper 130 becomes a second transition-state opening width H2 that is larger than the first transition-state opening width H1.

When the hand 110 further advances a predetermined distance as illustrated in FIG. 8A, the angle α further increases, and the cam 141 further rotates accordingly. The followers 142 come into contact with the second circular region of the cam surface 141a, and the followers 142 are located at positions (top dead centers) farthest from the cam 141. The pair of clamps 131 are in a positional relationship farthest from each other in the X direction, the gripper 130 is put into an open state, and the opening width of the gripper 130 becomes an open-state opening width H3. The storage container 90 is not sandwiched by the pair of clamps 131 in the X direction, and a gap is formed between the storage container 90 and each contact portion 131a of the clamp 131.

Figure 9:
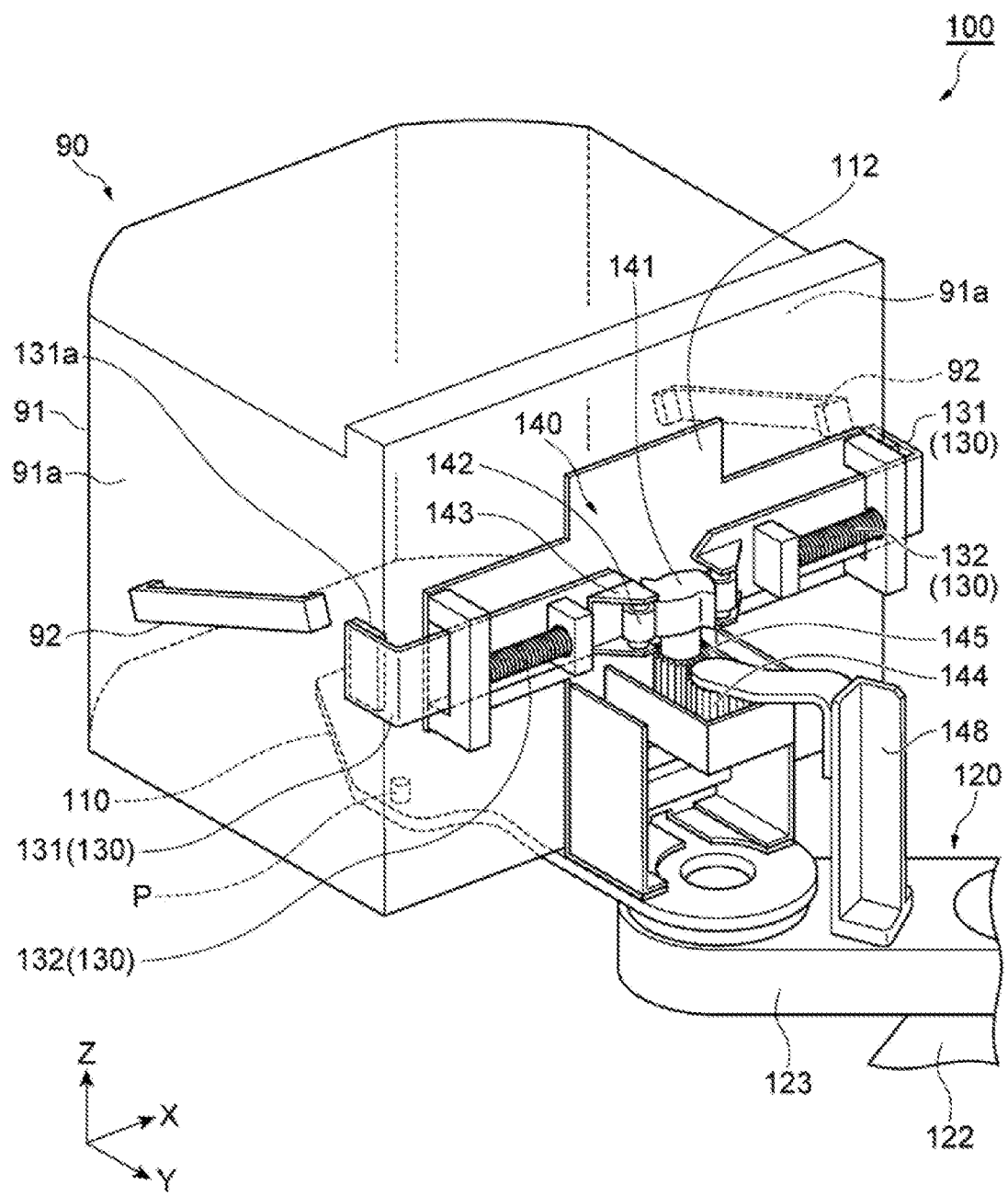
FIG. 9 is a perspective view illustrating when the gripper is in an open state in the transfer device in FIG. 1.

When the hand 110 further advances to the position of the transfer point as illustrated in FIGS. 8B and 9, the angle α further increases, and the cam 141 further rotates accordingly. Although the cam 141 further rotates, the followers 142 are continuously in contact with the second circular region of the cam surface 141a, and the followers 142 do not move and continuously lie at the top dead centers. The pair of clamps 131 do not further move apart in the X direction, the gripper 130 is maintained in an open state, and the opening width of the gripper 130 is continuously the open-state opening width H3. Although the advancing operation of advancing the hand 110 has been described above, the retreating operation of when the hand 110 is retreated from the position of the transfer point to the position of the first origin progresses in reverse to the advancing operation.

In the transfer device 100, a storage container 90 placed on the hand 110 is gripped by the gripper 130 in the X direction as described above. It therefore becomes possible to stabilize the posture of the storage container 90 on the hand 110 in the X direction even when the storage container 90 is transferred at high speed. In addition, it is possible to prevent the storage container 90 from falling down on the hand 110. Furthermore, it is possible to keep vibration of the storage container 90 on the hand 110 within a standard range. In addition, by gripping the storage container 90 with a frictional force of a predetermined value or more, it is possible to stabilize the posture of the storage container 90 not only in the X direction, but also in the Z direction, and prevent the storage container 90 from falling from the hand 110.

It is required to shorten the time (so-called cycle time) required for transferring the storage container 90, the speed and acceleration/deceleration of the transfer device 100 and the hand 110 increase with shortening of the cycle time in this example and, therefore, the storage container 90 on the hand 110 is likely to be unstable. Therefore, the transfer device 100 that stabilizes the posture of the storage container 90 on the hand 110 is particularly effective in this example.

In the transfer device 100, the gripper 130 is configured to be able to open and close between an open state and a closed state. The transfer device 100 is provided with an interlocking mechanism 140 that interlocks advancing/retreating of the hand 110 with opening/closing of the gripper 130. In this configuration, the opening/closing operation time of the gripper 130 does not become an idle time, and it is possible to suppress influence of the opening/closing operation on the cycle time. Compared to when the gripper 130 is driven by a separate motor, extra operation time is not generated, and it becomes possible to suppress an increase in cycle time.

In the transfer device 100, the interlocking mechanism 140 includes the cam 141 configured to rotate according to advancing/retreating of the hand 110, the followers 142 in contact with the cam 141 and follow along the X direction, and the coupling units 143 that couple the followers 142 to the gripper 130. In this configuration, it is possible to efficiently realize interlocking of advancing/retreating of the hand 110 with opening/closing of the gripper 130 by the interlocking mechanism 140.

In the transfer device 100, the cam 141 has a cam shape in which the gripper 130 has a certain open-state opening width H3 when the hand 110 has advanced a certain distance or more. In this configuration, the gripper 130 is not opened more than the open-state opening width H3 while the hand 110 advances and, therefore, it becomes possible to cope with a situation where there is little clearance around the storage container 90 in the storage shelf 50.

In the transfer device 100, each storage container 90 includes the container body 91 having a width L1 that is narrower than the maximum width L2 in the X direction. The gripper 130 grips the container body 91 of a storage container 90. In this configuration, the width of the gripper 130 in the X direction as the gripping direction can be reduced in a state in which the storage container 90 is gripped by the gripper 130. Accordingly, it becomes possible to cope with a situation where there is little clearance around the storage container 90 in the storage shelf 50.

The transfer device 100 is further provided with a positioning pin P erected on the hand 110. When a plurality of positioning pins P are provided, floating of the storage container 90 (tilting of the storage container 90 with any one of the plurality of positioning pins P as a fulcrum) may occur as the storage container 90 placed on the hand 110 is pressed from above, for example. In this respect, since the gripper 130 grips the storage container 90 on the hand 110 in the X direction, it is possible to avoid floating of the storage container 90 even when a plurality of positioning pins P are provided. In addition, it is possible to position the storage container 90 with the positioning pins P.

The stacker crane 7 is provided with the transfer device 100, the elevating unit 74, and the turning unit 75. The stacker crane 7 provided with the transfer device 100 also exhibits the above effect, that is, an effect of stabilizing the posture of the storage container 90 on the hand 110 in the X direction even when the storage container 90 is transferred (especially turned) at high speed. Moreover, the posture of the storage container 90 can be stabilized while being turned by the turning unit 75 and while being elevated and lowered by the elevating unit 74.

In the transfer device 100, springs 132 are provided, and a certain elastic force is applied to the clamp 131 in a direction in which the storage container 90 is sandwiched. As a result, it becomes possible to manage the holding force of the storage container 90 with the spring 132, and always hold the storage container 90 with a certain force or more.

Although one basic example has been described above, this disclosure is not limited to the above example, and various modifications can be made without departing from the spirit of this disclosure.

In the above example, the transfer device 100 may be applied to a stacker crane having a configuration different from that of the stacker crane 7 described above. The transfer device 100 can be applied to a transfer device that can move only in either the horizontal direction or the vertical direction, a transfer device that can move in the horizontal direction along a track laid not on the floor surface but near the ceiling, or the like.

Although the above example has been described using a storage container 90 such as FOUP as an example of a conveyed object, a reticle pod that stores a reticle may be employed. In addition, a conveyed object such as a cardboard or a returnable box may be employed.

What is claimed is:

1. A transfer device for transferring a conveyed object by advancing and retreating a placement portion on which the conveyed object is placed, the transfer device comprising
    a gripper that grips the conveyed object placed on the placement portion in a horizontal direction, and is configured to be able to open and close between an open state in which the conveyed object is not gripped and a closed state in which the conveyed object is gripped, and
    an interlocking mechanism that interlocks advancing and retreating of the placement portion with opening and closing of the gripper,
    wherein the interlocking mechanism includes a cam configured to rotate in accordance with advancing and retreating of the placement portion, a follower in contact with the cam and follows along a horizontal direction, and a coupling unit that couples the follower to the gripper.

2. The transfer device according to claim 1, wherein the cam has a cam shape in which the gripper has a selected opening width when the placement portion has advanced a selected distance or more.

3. The transfer device according to claim 1,
    wherein the conveyed object includes a narrow portion having a width narrower than a maximum width in a horizontal direction as a gripping direction of the gripper, and
    the gripper grips the narrow portion of the conveyed object.

4. The transfer device according to claim 1, further comprising a plurality of positioning pins erected on the placement portion and support the conveyed object.

5. A stacker crane comprising:
    a transfer device according to claim 1;
    a turning unit that turns the transfer device; and
    an elevating unit that elevates and lowers the transfer device.

6. A stacker crane comprising:
    a transfer device according to claim 2;
    a turning unit that turns the transfer device; and
    an elevating unit that elevates and lowers the transfer device.

7. A stacker crane comprising:
    a transfer device according to claim 3;
    a turning unit that turns the transfer device; and
    an elevating unit that elevates and lowers the transfer device.

8. A stacker crane comprising:
    a transfer device according to claim 4;
    a turning unit that turns the transfer device; and
    an elevating unit that elevates and lowers the transfer device.

* * * * *